US006946365B2

(12) United States Patent
Aspar et al.

(10) Patent No.: US 6,946,365 B2
(45) Date of Patent: Sep. 20, 2005

(54) METHOD FOR PRODUCING A THIN FILM COMPRISING INTRODUCTION OF GASEOUS SPECIES

(75) Inventors: Bernard Aspar, Rives (FR); Michel Bruel, Veurey-Voroize (FR)

(73) Assignee: Commissariat a l'Energie Atomique, Paris (FR)

(*) Notice: Subject to any disclaimer, the term of this patent is extended or adjusted under 35 U.S.C. 154(b) by 133 days.

(21) Appl. No.: 10/432,362

(22) PCT Filed: Dec. 7, 2001

(86) PCT No.: PCT/FR01/03873

§ 371 (c)(1),
(2), (4) Date: May 30, 2003

(87) PCT Pub. No.: WO02/47156

PCT Pub. Date: Jun. 13, 2002

(65) Prior Publication Data

US 2004/0092087 A1 May 13, 2004

(30) Foreign Application Priority Data

Dec. 8, 2000 (FR) .............................. 00 15980

(51) Int. Cl.⁷ .......................... H01L 21/30; H01L 21/46
(52) U.S. Cl. ..................................................... 438/457
(58) Field of Search ......................................... 438/457

(56) References Cited

U.S. PATENT DOCUMENTS

| | | | |
|---|---|---|---|
| 3,341,396 A | 9/1967 | Iverson | |
| 4,102,847 A | 7/1978 | Hartmann et al. | |
| 4,578,418 A | 3/1986 | Krueger | |
| 4,609,690 A | 9/1986 | Gruber et al. | |
| 4,877,656 A | 10/1989 | Baskin | |
| 5,278,223 A | 1/1994 | Gruenewaelder et al. | |
| 5,468,461 A | 11/1995 | Hosoda et al. | |
| 5,472,649 A | 12/1995 | Chang et al. | |
| 5,804,646 A | 9/1998 | Witte et al. | |
| 6,191,007 B1 * | 2/2001 | Matsui et al. | ................ 438/459 |
| 6,271,293 B1 | 8/2001 | Karuga et al. | |

FOREIGN PATENT DOCUMENTS

| | | |
|---|---|---|
| DE | 43 38 265 C1 | 12/1994 |
| DE | 44 33 854 A1 | 2/1996 |
| EP | 0 665 588 | 8/1995 |
| EP | 0 763 849 | 3/1997 |
| EP | 0 767 486 | 4/1997 |
| EP | 0 872 338 A1 | 10/1998 |
| JP | 55-126583 | 9/1980 |
| JP | 8-295548 | 11/1996 |
| JP | 10-128911 | 5/1998 |
| JP | 10 308355 | 11/1998 |
| JP | 11-126910 | 5/1999 |

OTHER PUBLICATIONS

"Sol Interposer structure" IBM Technical Disclosure Bulletin, IBM Corp., vol. 39, No. 7, pp. 191–195 Jul. 1, 1996.

* cited by examiner

Primary Examiner—W. David Coleman
(74) Attorney, Agent, or Firm—Oblon, Spivak, McClelland, Maier & Neustadt, P.C.

(57) ABSTRACT

A method for making a thin layer from a structure. A stacked structure is made of a first part designed to facilitate the introduction of gaseous species and of a second part, the second part having a first free face and a second face integral with the first part. A gaseous species is introduced into the structure, from the first part, to create an embrittled zone, a thin layer being thus delimited between the first face of the second part and the embrittled zone. The thin layer is separated from the remaining of the structure at the level of the embrittled zone.

19 Claims, 3 Drawing Sheets

METHOD FOR PRODUCING A THIN FILM COMPRISING INTRODUCTION OF GASEOUS SPECIES

TECHNICAL FIELD

The present invention concerns a method for making a thin layer involving the introduction of gaseous species. It allows in particular layers of relatively significant thickness to be made. It finds applications particularly in the field of semi-conductors.

STATE OF THE PRIOR ART

The introduction of gaseous species into a solid material may be advantageously achieved by ion implantation. Thus, the document FR-A-2 681 472 (corresponding to U.S. Pat. No. 5,374,564) describes a method for manufacturing thin films of semi-conductor material. This document discloses that the implantation of a rare gas and/or of hydrogen into a substrate made of a semi-conductor material is likely to induce, in certain conditions, the formation of microcavities or platelets to a depth close to the average depth of penetration of the implanted ions. If this substrate is brought into intimate contact, by its implanted face, with a stiffener and a heat treatment is applied at sufficient temperature, an interaction occurs between the microcavities or platelets leading to a separation of the semi-conductor substrate into two parts: a thin semi-conductor film adhering to the stiffener on the one hand, the remaining of the semi-conductor substrate on the other hand. The separation takes place at the level of the zone where the microcavities or platelets are present. The heat treatment is such that the interaction between the platelets or microcavities created by implantation is able to induce a separation between the thin film and the remaining of the substrate. The transfer is thus obtained of a thin film from an initial substrate to a stiffener acting as a support to this thin film.

The creation of an embrittled zone and the separation at the level of this zone may also be used to manufacture a thin film of solid material other than a semi-conductor material, a conductor or dielectric material, which may or may not be crystalline (see document FR-A-2 748 850).

This method proves very advantageous and is particularly used to obtain SOI substrates. The entry of these ions may produce disturbance for certain applications. However, the thickness of the thin film obtained depends on the implantation energy provided by the implanters. Obtaining relatively thick films (50 μm for example) requires very powerful implanters, a fact which sets a limit in respect of the thicknesses available. It may additionally present a drawback in the sense that the thin film obtained has been passed through by the ions intended to form the microcavities.

The document FR-A-2 738 671 (corresponding to the U.S. Pat. No. 5,714,395) discloses a method also using ion implantation to create an embrittled zone which makes it possible, by means of a subsequent treatment, to obtain the separation of a surface layer from with the remaining of an initial substrate. According to this document, the ion implantation is carried out to a depth greater than or equal to a minimum pre-set depth so that the thin film obtained is rigid after its separation from with the remaining of the initial substrate. By rigid film is understood a film which is self supporting, in other words mechanically independent and able to be used or manipulated directly.

SUMMARY OF THE INVENTION

To overcome these drawbacks, the present invention proposes implanting (or introducing) the gaseous species through the rear face of the substrate, in other words through the face of the substrate opposite to the thin film or layer required. To do this, the substrate must be "transparent to ions" on the side of its rear face.

The object of the invention is thus a method for making a thin layer from a structure, the method involving the introduction of gaseous species to create an embrittled zone leading to a separation of the structure at the level of this embrittled zone, the method being characterised in that it includes the following steps:

a) making a stacked structure formed of a first part designed to facilitate the introduction of gaseous species and of a second part, the second part having a first free face and a second face integral with the first part, b) introducing gaseous species into the structure, from the first part, so as to create an embrittled zone, the thin layer being thus delimited between said first free face of the second part and said embrittled zone, c) separating the thin layer from the remaining of the structure at the level of the embrittled zone.

Preferably, the introduction of gaseous species is carried out by ion implantation through the free face of the first part.

The introduction of gaseous species may create an embrittled zone in the first part, in the second part or at the interface between the first part and the second part.

The first part may include a material of high porosity or low stopping power in respect of gaseous species or of thickness corresponding to the depth of penetration of the gaseous species into this first part.

The introduction of gaseous species being carried out by ion implantation, the first part may include a support transparent to the implanted gaseous species, in other words a support having openings to the implanted gaseous species, the ratio of the total surface of the openings relative to the surface of the support being such that the separation may occur at the level of the embrittled zone created. The support may be a grid, the first part also including a film deposited on the grid and integral with the second part.

The first part may be a self supporting film initially laid on a support, the second part being formed on the first part by growth to provide a manipulable structure. The growth of the second part may be achieved by a CVD deposit method or a liquid phase epitaxy method.

To advantage, the first part includes a surface layer acting as the seed for the growth of the second part on the first part. The growth of the second part may be achieved by a CVD deposit method or a liquid phase epitaxy method. The introduction of gaseous species may be achieved in such a way that the embrittled zone leaves behind, after separation, on the surface of the first part, a layer able to act as the seed to grow anew a second part on the second part.

Possibly, before step b) or before step c), an intermediate support is fixed on the first part. After step c), the intermediate support may be eliminated.

The structure may include a layer intended to favour separation, the gaseous species being introduced into this layer.

The separation step may be carried out by supplying thermal and/or mechanical energy to the embrittled zone.

The separation step may implement an energy supply to initiate a cleavage action using a cleavage edge propagating along the embrittled zone. This technique is particularly disclosed by the document WO 98/52 216.

The gaseous species may be selected from among hydrogen and rare gases, these species being able to be introduced alone or in combination.

BRIEF DESCRIPTION OF THE DRAWINGS

The invention will be better understood and other advantages and particularities will emerge from reading the following description, given as a non-remainingrictive example, accompanied by the appended drawings among which.

DETAILED DESCRIPTION OF EMBODIMENTS OF THE INVENTION

FIGS. 1A to 1D show an embodiment of the invention wherein the first part of the structure includes a grid.

Figure 1A:
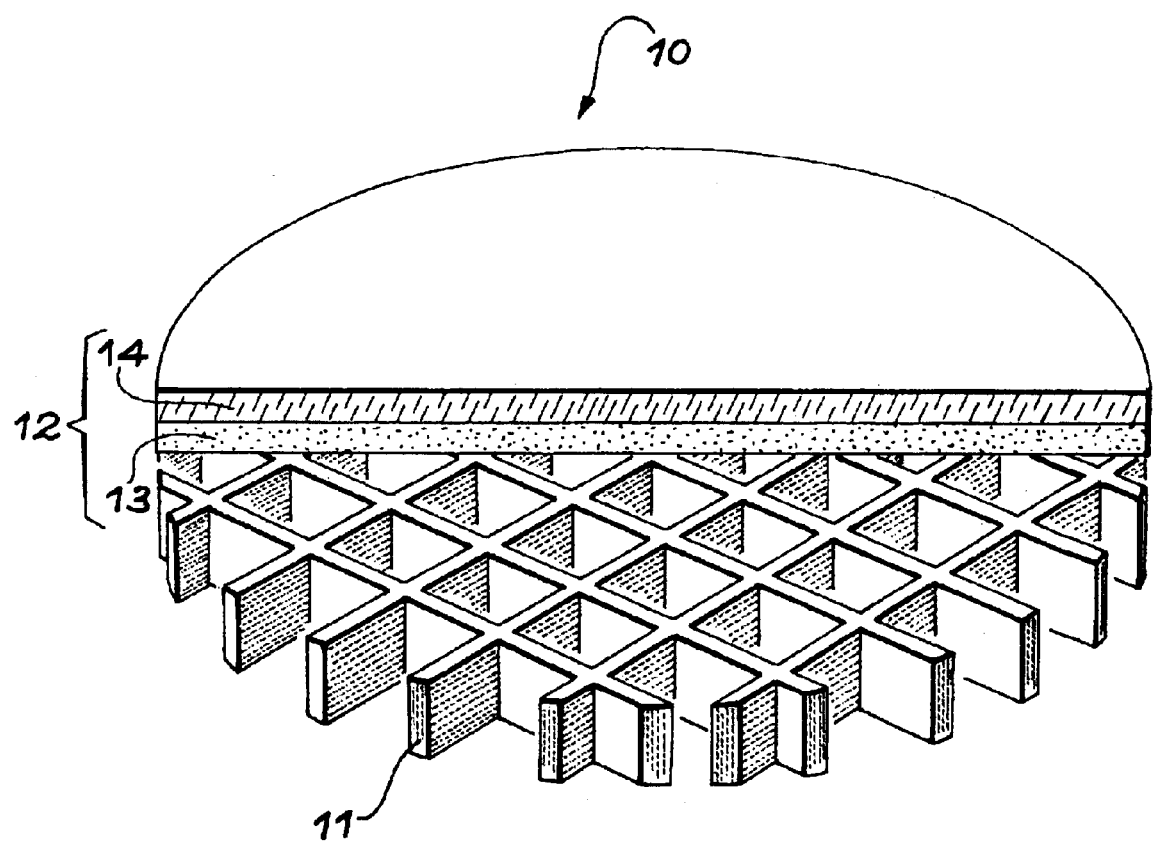
FIGS. 1A to 1D show a first embodiment of the present invention.

FIG. 1A is a perspective and partial cross-section view of this first part 10. The first part 10 includes a grid 11 formed of bars which may be square or rectangular in cross-section. The bars are for example 80 µm wide and may be spaced out from a few hundreds of micrometers to a few millimeters. According to the dimensions of the bars and of the spacings which separate them, the grid may act as a stiffener and allow separation at the level of the implanted zone without inducing the formation of blisters.

When the spacings between the bars are too big and/or if the depth of penetration of the ions is not sufficient to induce a separation (blistering then occurs) and produce a self supporting film, after the implantation step a layer may be deposited which acts as a stiffener on the free face of the first part.

The grid 11 may be made by etching a Si or SiC wafer.

The grid 11 acts as a support to a film 12 formed of one or more layers, for example of two layers 13 and 14. If it is required to obtain at the end of the method a thin layer of mono-crystalline silicon, the layer 13 may be of $SiO_2$ and be 1 µm thick and the layer 14 may be of silicon and be 2 µm thick. The film 12 may be obtained and deposited on the grid 11 by the method disclosed in the document FR-A-2 738 671 cited above. The film 12 may be made integral with the grid 11 by a technique of molecular adhesion known to the man skilled in the art. An adhesive may also be used to bond the film 12 and the grid 11 while ensuring that the adhesive does not disturb the ion implantation.

Figure 1B:
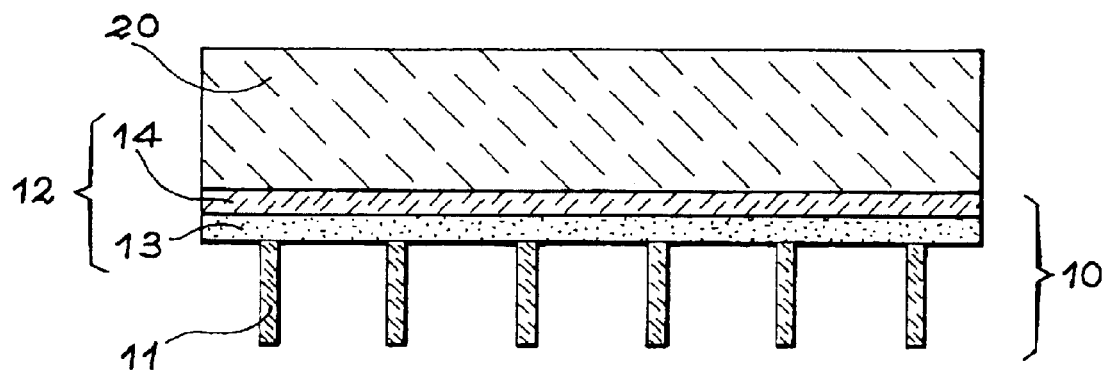

The layer 14 may then be used in the formation of the second part of the structure. This is shown in FIG. 1B which is a transverse cross-section view of the structure. The second part 20 is a layer of mono-crystalline silicon obtained by growth from the layer 14 acting as the seed. The growth is for example obtained by a technique of CVD deposit or by liquid phase epitaxy. The second part 20 may then reach a thickness of several µm, even a few tens of µm, for example 50 µm.

Figure 1C:
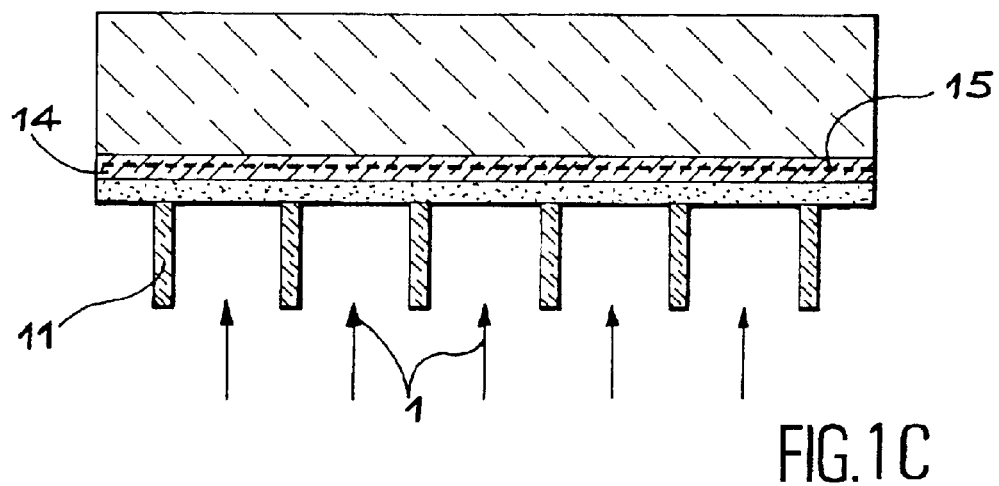

FIG. 1C, which is also a transverse cross-section view of the structure, shows the ion implantation step carried out through the grid 11. Ion implantation may consist in implanting hydrogen ions, represented symbolically by the arrows 1, with a dose of $10^{17} H^+/cm^2$ and an energy of 400 keV. The ions in the majority reach the layer 14 of silicon to form therein an embrittled zone 15.

The introduction of gaseous species into a layer of material to constitute an embrittled zone may also be carried out by other methods used alone or in combination and described in the document FR-A-2 773 261.

Figure 1D:
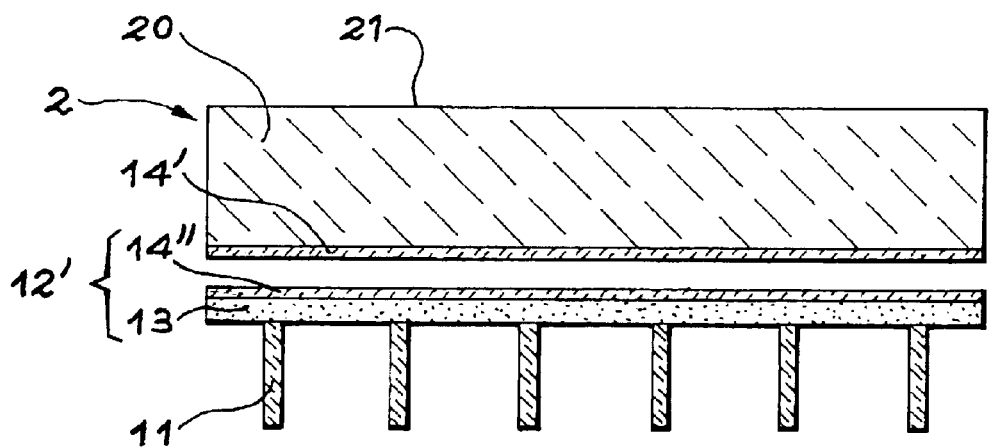

FIG. 1D, which is also a transverse cross-section view of the structure, shows the separation step. Separation may take place by heat annealing and/or by using mechanical forces. A thin layer 2 is then obtained between the free face 21 of the second part 20 and the initial location of the embrittled zone. The initial layer 14 is then split into two sub-layers 14' and 14". The thin layer 2, of about 50 µm thick, is recovered to be used. The remaining of the structure, constituted by the stack grid 11, layer 13 and sub-layer 14" (forming the film 12'), may be re-used as a new first part, the sub-layer 14" acting as the seed for the formation of a new second part.

In this embodiment, the embrittled zone has been created in the layer 14 belonging to the first part of the structure, the thin layer obtained then including the first part of the structure and a portion of the second part (the sub-layer 14'). It also falls within the framework of the present invention to create the embrittled zone at the interface of the two parts, in which case the thin layer obtained would correspond exactly to the second part of the structure. This variant has one advantage: a defect zone created at this interface favours separation. This defect zone may contain crystal defects and/or microcavities which will favour separation. It is also possible to create the embrittled zone in the second part of the structure, in which case the thin layer obtained would correspond to a portion of the second part.

In one variant of the method, the introduction of gaseous species may be carried out for an implantation energy of 200 keV for example. In this event, prior to separation, a layer which acts as a stiffener and which allows separation is added onto the free face of the first part. This layer may be constituted for example of 3 µm of silicon oxide.

The second part of the structure may also be constituted of a layer stack. It may be, temporarily or not, fixed to an intermediate support.

There may be provided in the structure a specific layer, made for example prior to the formation of the second part, intended to favour separation at the level of the embrittled zone. The specific layer may be a SiGe layer epitaxied on a silicon layer of the first part. The second part is epitaxied on the SiGe layer and implantation is carried out at the level of the stressed SiGe layer. The specified layer may be a layer of silicon heavily doped with boron. Such a material allows separation to be obtained by means of a lower thermal and/or mechanical budget.

FIGS. 2A to 2D show another embodiment of the invention wherein the first part of the structure is constituted by a self supporting film. These figures are transverse cross-section views.

Figure 2A:
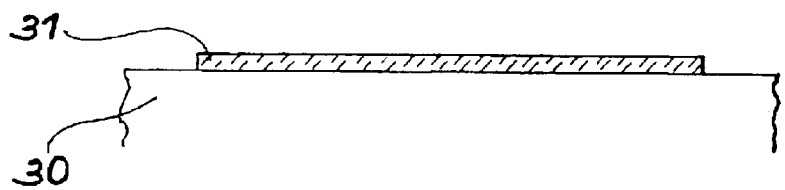
FIGS. 2A to 2D show a second embodiment of the present invention.

FIG. 2A shows a self supporting film 31 deposited on a support 30 without adhering to it. The self supporting film 31 is for example a 5 µm thick silicon film obtained by the method disclosed in the document FR-A-2 738 671 cited above. This film 31 constitutes the first part of the structure.

Figure 2B:
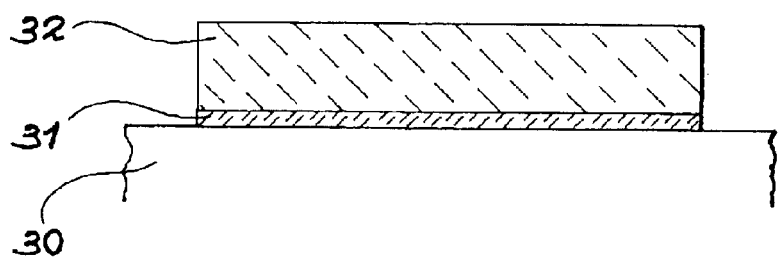

FIG. 2B shows that a layer 32 has been formed on the film 31. The layer 32 may be a 45 µm thick silicon layer, epitaxied on the layer 31. The layer 32 constitutes the second part of the structure. A manipulable structure is thus obtained.

Figure 2C:
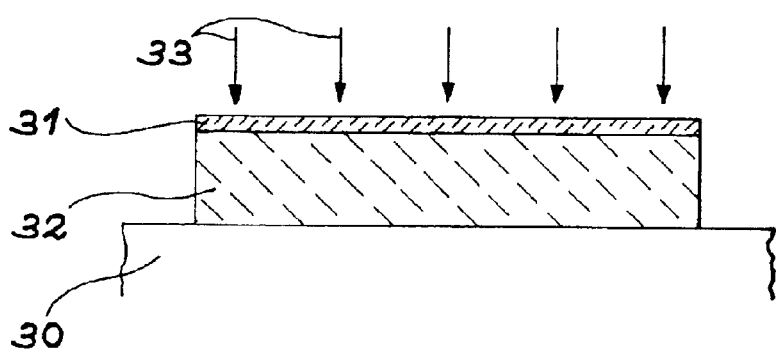

FIG. 2C shows the structure which has been turned over on its support 30 to undergo the ion implantation step. Hydrogen ions (represented symbolically by the arrows 33) are then implanted, for example for a dose of $10^{17} H^+/cm^2$ and with an energy of 500 keV. In this embodiment example, the embrittled zone is created at the interface between the two parts 31 and 32. To create this embrittled zone, a co-implantation of helium and hydrogen for example may be used.

Figure 2D:
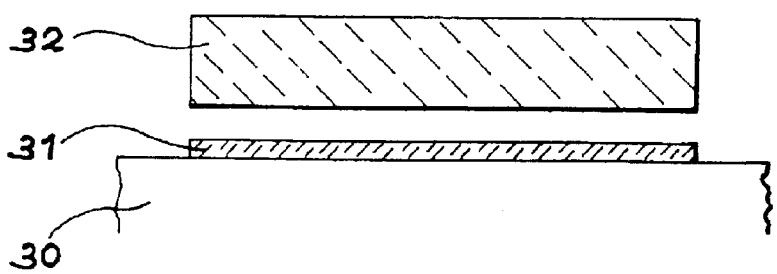

The structure is again turned over on its support and, for example by a heat treatment or by a partial heat treatment followed by an application of mechanical forces, separation between the parts 31 and 32 is obtained. A thin layer is obtained constituted by the second part 32 as shown in FIG. 2D. The part 31 may be used again to apply the method of the invention.

The invention applies to obtaining thin layers of different materials. It is thus possible to obtain self supporting layers of GaN for optoelectronic or microelectronic applications. In this event, the self supporting film may be of SiC. On this film, a thick layer of GaN may be made for example by epitaxy at 1050° C. Hydrogen is then implanted at a dose of $10^{16} H^+/cm^2$ at 250 keV into the SiC in the vicinity of the interface with GaN. By means for example of a heat treatment at 850° C., separation is obtained at the level of the implanted zone. A self supporting GaN film is obtained equipped with a thin layer of SiC arising from the separation. The remaining of the SiC film, which is still self supporting, may be recycled.

What is claimed is:

1. A method for making a thin layer from a structure, comprising:

making a stacked structure formed of a first part, having a first face and an opposed second face, designed to facilitate introducing of gaseous species through its first face, and of a second part, the second part having a first free face and an opposed second face integral with the second face of the first part;

introducing gaseous species into the stacked structure, through the first face of the first part, to create an embrittled zone, a thin layer being thus delimited between the first face of the second part and the embrittled zone; and separating the thin layer from a remaining part of the structure at a level of the embrittled zone.

2. Method according to claim 1, wherein the introducing of gaseous species is carried out by ion implantation through the free face of the first part.

3. Method according to claim 1, wherein the introducing of gaseous species creates the embrittled zone in the first part.

4. Method according to claim 1, wherein the introducing of gaseous species creates the embrittled zone in the second part.

5. Method according to claim 1, wherein the introducing of gaseous species creates the embrittled zone at an interface between the first part and the second part.

6. Method according to claim 1, wherein the first part includes a material of high porosity or low stopping power in respect of gaseous species or of thickness corresponding to a depth of penetration of the gaseous species into the first part.

7. Method according to claim 1, wherein the first part is a self supporting film initially laid on a support, the second part being formed on the first part by growth to provide a manipulable structure.

8. Method according to claim 1, wherein the first part includes a surface layer acting as a seed for growth of the second part on the first part.

9. Method according to claim 1, wherein before the introducing or before the separating, an intermediate support is fixed on the first part.

10. Method according to claim 1, wherein the structure includes a layer configured to favor separation, the gaseous species being introduced into the layer configured to favor separation.

11. Method according to claim 1, wherein the separating is carried out by supplying at least one of thermal and mechanical energy to the embrittled zone.

12. Method according to claim 1, wherein the separating implements an energy supply to initiate a cleavage action using a cleavage edge propagating along the embrittled zone.

13. Method according to claim 1, wherein the gaseous species are selected from among hydrogen and rare gases, the species being configured to be introduced alone or in combination.

14. Method according to claim 2, wherein the first part includes a support having openings to the implanted gaseous species, a ratio of a total surface of the openings relative to a surface of the support being such that the separating may occur at the level of the embrittled zone.

15. Method according to claim 14, wherein the support is a grid, the first part also including a film deposited on the grid and integral with the second part.

16. Method according to claim 7, wherein the growth of the second part is achieved by a CVD deposit or a liquid phase epitaxy.

17. Method according to claim 8, wherein the growth of the second part is achieved by a CVD deposit or a liquid phase epitaxy.

18. Method according to claim 8, wherein the introducing of gaseous species is achieved such that the embrittled zone leaves behind, after separation, on a surface of the first part, a layer configured to act as a seed to grow a Previously Presented a second part on the first part.

19. Method according to claim 9, wherein after the separating, the intermediate support is eliminated.

* * * * *